(12) United States Patent
Ishida et al.

(10) Patent No.: US 7,410,698 B2
(45) Date of Patent: Aug. 12, 2008

(54) CONDUCTIVE PARTICLE WITH PROTRUSIONS AND ANISOTROPIC CONDUCTIVE MATERIAL THEREFROM

(75) Inventors: Hiroya Ishida, Kouka (JP); Takeshi Wakiya, Osaka (JP); Shinya Uenoyama, Kouka (JP)

(73) Assignee: Sekisui Chemical Co., Ltd., Osaka (JP)

( * ) Notice: Subject to any disclaimer, the term of this patent is extended or adjusted under 35 U.S.C. 154(b) by 141 days.

(21) Appl. No.: 10/559,688

(22) PCT Filed: Jan. 27, 2005

(86) PCT No.: PCT/JP2005/001058

§ 371 (c)(1),
(2), (4) Date: Dec. 6, 2005

(87) PCT Pub. No.: WO2005/073985

PCT Pub. Date: Aug. 11, 2005

(65) Prior Publication Data

US 2007/0092698 A1  Apr. 26, 2007

(30) Foreign Application Priority Data

Jan. 30, 2004 (JP) .............................. 2004-024063
Aug. 20, 2004 (JP) .............................. 2004-241571

(51) Int. Cl.
*B32B 5/16* (2006.01)

(52) U.S. Cl. .................... 428/403; 428/570; 252/512
(58) Field of Classification Search ................ 428/403, 428/570; 252/512
See application file for complete search history.

(56) References Cited

U.S. PATENT DOCUMENTS

| 5,750,249 | A  | * | 5/1998  | Walther et al. ............ 428/328 |
| 6,770,369 | B1 | * | 8/2004  | Oyamada et al. ........... 428/403 |
| 7,291,393 | B2 | * | 11/2007 | Wakiya et al. ............. 428/403 |

FOREIGN PATENT DOCUMENTS

| JP | 63-301408   |   | 12/1988 |
| JP | 4-036902    |   | 2/1992  |
| JP | 08-055514   |   | 2/1996  |
| JP | 11-134934   |   | 5/1999  |
| JP | 2000-243132 |   | 9/2000  |
| JP | 2006-216388 | * | 8/2006  |
| WO | WO-00/51138 |   | 8/2000  |

* cited by examiner

OTHER PUBLICATIONS

International Search Report dated May 31, 2005.

*Primary Examiner*—H. T Le
(74) *Attorney, Agent, or Firm*—Cheng Law Group PLLC

(57) ABSTRACT

A conductive particle having a low connection resistance, a small variation of conduction performance, and excellent conduction reliability and an anisotropic conductive material using such particles are disclosed. Conventional anisotropic conductive materials using conductive particles are used in the form that they are interposed between opposed boards or between opposed electrode terminals of electronic devices such as mobile telephones. However, as electronic devices have been recently developing, enhancement of the conduction reliability of the conductive particles used for the anisotropic conductive materials have been required. The surface (2) of the base particle of a conductive particle (1) of the invention used for an anisotropic conductive material is covered with a conductive film or films (4, 5). The conductive particle (1) has projections (5b) projecting from the conductive film or films. A core material (3) for projecting the surface of the conductive film is provided on the surface of the base particle. The core material (3) is different from the conductive material of the conductive films. By thus using such conductive particles, the conduction reliability is enhanced.

10 Claims, 4 Drawing Sheets

CONDUCTIVE PARTICLE WITH PROTRUSIONS AND ANISOTROPIC CONDUCTIVE MATERIAL THEREFROM

TECHNICAL FIELD

The present invention relates to a conductive particle having a low connection resistance, a small variation of conduction performance of the particle, and excellent conduction reliability and an anisotropic conductive material using the conductive particles.

BACKGROUND ART

Conductive particles are widely used for anisotropic conductive materials such as anisotropic conductive paste, anisotropic conductive ink, an anisotropic conductive pressure sensitive adhesive/an anisotropic conductive adhesive, an anisotropic conductive film and an anisotropic conductive sheet by mixing them with a binder resin or a pressure sensitive adhesive/an adhesive and kneading.

These anisotropic conductive materials are used in the form that they are interposed between opposed boards or between opposed electrode terminals of electronic devices such as a liquid crystal display, a personal computer and a mobile telephone in order to electrically connect a board to another board or to electrically connect a small part such as a semiconductor device to a board.

As the conductive particles used for the above anisotropic conductive materials, there have been previously employed a conductive particle in which a metal-plated layer is formed as a conductive film on the surface of a nonconductive particle such as a resin particle having a uniform particle diameter and moderate strength. However, in recent years, as electronic devices have been sharply progressing and developing, further reduction of the connection resistance of the conductive particles used for the anisotropic conductive materials have been required.

In Japanese Unexamined Patent Publication No. 4-36902 and Japanese Unexamined Patent Publication No. 2000-243132, there are reported a conductive particle having projections on their surface as a conductive particle for reducing the connection resistance of the above conductive particle.

In Japanese Unexamined Patent Publication No. 4-36902, there is described a conductive particle prepared by metal-plating the surface of a nonconductive particle, which is provided with projections on its surface. However, this is a particle with projections formed from a combined particle of a mother particle and child particles, and plastic or glasses such as silicate glass were used for a projection portion of this particle. Accordingly, materials composing the projection were nonconductive, and it was difficult to reduce the connection resistance and improve the conductivity.

In Japanese Unexamined Patent Publication No. 2000-243132, there is described a method of producing a conductive electroless plated powder by simultaneously forming minute nickel projections and a nickel coat on a nonconductive particle through the use of the self-decomposition of a nickel plating solution in an electroless nickel plating method. However, in this production method, since it was extremely difficult to control the size, the shape and the amount of a minute nickel particle with which a projection was formed, it was extremely difficult to control the number, the size, and the shape of the projection to be obtained. And, since the minute particle was deposited and produced in the step of plating by using a nickel plating solution containing much phosphoric components, it had a disadvantage that conductivity was deteriorated due to the much content of phosphorus.

DISCLOSURE OF THE INVENTION

In view of the above state of the art, it is an object of the present invention to provide a conductive particle having a low connection resistance, a small variation of conduction performance of the particle, and excellent conduction reliability. In addition, it is also an object of the present invention to provide an anisotropic conductive material, which uses the conductive particles, having a low connection resistance, a small variation of conduction performance, and excellent conduction reliability.

The first present invention provides a conductive particle of which the surface of a base particle is covered with a conductive film or films and which has projections formed by projecting of the above-mentioned conductive film or films, wherein a core material for projecting the surface of the above-mentioned conductive film is provided on the surface of the above-mentioned base particle and the above-mentioned core material is composed of a conductive material different from a conductive material composing the above-mentioned conductive film or films.

Further, in a certain specific aspect of the first present invention, the core material has a shape in lump form.

Further, in another specific aspect of the first present invention, the outermost surface of the above-mentioned conductive film is a gold layer.

Further, the second present invention provides a conductive particle, which has a core material in particle form, composed of a conductive material, on the surface of a base particle, in which the above-mentioned base particle and the above-mentioned core material are covered with a plated coat and which has projections formed by projecting of the above-mentioned plated coat by thus covering the above-mentioned core material.

Further, in a certain specific aspect of the second present invention, at least 80% or more of the above-mentioned core material existing on the surface of the base particle contacts with the above-mentioned base particle or exists within a range of 5 nm from the above-mentioned base particle.

In addition, in another specific aspect of the second present invention, the outermost surface of a plated coat is a gold layer.

Further, in another specific aspects of the first and the second present inventions, the core material is composed of at least one or more species of metal.

Further, in another specific aspects of the first and the second present inventions, the base particle is a resin particle.

Further, in another specific aspects of the first and the second present inventions, an average height of the projection portions projecting is 0.5% or more of an average particle diameter of the conductive particles.

An anisotropic conductive material in which the conductive particles constructed according to the present invention are dispersed in a resin binder is provided.

The conductive particle concerning the first present invention has a low connection resistance, a small variation of conduction performance of the particle, and excellent conduction reliability since the surface of the base particle of the conductive particle is covered with conductive films, the conductive particle has projections formed by projecting of the conductive film, a core material for projecting the surface of the conductive film is provided on the surface of the base particle and the core material is composed of the conductive material different from the conductive material composing the conductive film.

When the core material of the first present invention has a shape in lump form, the projection appears as a projection which can be adequately observed on the surface of the conductive film.

When the outermost surface of the conductive film of the first present invention is a gold layer, the connection resistance can be more reduce and the surface of the conductive particle can be stabilized.

The conductive particle concerning the second present invention has a low connection resistance, a small variation of conduction performance of the particle, and excellent conduction reliability since the conductive particle has a core material in particle form, composed of a conductive material, on the surface of a base particle, the above-mentioned base particle and the above-mentioned core material are covered with a plated coat and the above-mentioned conductive particle has projections formed by projecting of the plated coat by thus covering the core material.

If at least 80% or more of the core material in particle form existing on the surface of the base particle of the second present invention contacts with the base particle or exists within a range of 5 nm from the base particle, since the core material is surely covered with a plated coat, the cohesion of the projecting projection to the base particle is excellent and therefore the conduction reliability is further excellent.

When the outermost surface of a plated coat of the second present invention is a gold layer, the connection resistance can be more reduce and the surface of the conductive particle can be stabilized.

When the core material of the first and the second present inventions is composed of at least one or more species of metal, the conductivity of the projection portion is enhanced because the electric resistance of the core material can be reduced.

When the base particle of the first and the second present inventions is a resin particle, the base particle becomes resistant to damage because it has moderate flexibility and the conductive particle is elastically deformed in fixing it to an electrode by applying pressure.

When an average height of the projection portions projecting of the first and the second present inventions is 0.5% or more of an average particle diameter of the conductive particles, an effect of a projection can be surely exerted.

An anisotropic conductive material in which the conductive particles concerning the first or the second present inventions are dispersed in a resin binder has a low connection resistance, a small variation of conduction performance of the particle, and excellent conduction reliability in the case of using the conductive particles.

BEST MODE FOR CARRYING OUT THE INVENTION

Hereinafter, the present invention will be described in detail.

(First Present Invention)

A conductive particle of the first present invention is a conductive particle of which the surface of a base particle is covered with a conductive film or films and which has projections formed by projecting of the above conductive film or films.

Metal composing the above conductive film is not particularly limited and includes, for example, metals such as gold, silver, copper, platinum, zinc, iron, lead, tin, aluminum, cobalt, indium, nickel, chrome, titanium, antimony, bismuth, germanium and cadmium; and alloys composed of two or more species of metals such as tin-lead alloy, tin-copper alloy, tin-silver alloy and tin-lead-silver alloy. Among others, nickel, copper and gold are preferred.

A method of forming the above conductive film is not particularly limited and includes, for example, methods such as electroless plating, electroplating and sputtering. Among others, a method of forming the conductive film by electroless plating is suitably used when the base particle is a nonconductive resin particle. In addition, the metal composing the conductive film may further contain a phosphoric component which is a nonmetal component. When the conductive film is the plated coat, a plating solution relatively generally contains the phosphoric component. For example, the conductive film contains the phosphoric component in an amount 0.5 to 18 weight %. Also, the metal composing the conductive film may contain another nonmetal component. For example, the metal may contain a boron component.

A film thickness of the above conductive film is preferably 10 to 500 nm. When the film thickness is less than 10 nm, it may be difficult to obtain desired conductivity, and when it is more than 500 nm, this conductive film may become apt to peel because of the difference of thermal expansion coefficients between the base particle and the conductive film.

The conductive particle of the first present invention has a core material for projecting the surface of the conductive film on the surface of the base particle. The core material is composed of the conductive material different from the conductive material composing the conductive film.

That is, projection in the first present invention is composed of the above core material and the above conductive film and presents itself as a projection projecting from the surface of the conductive film.

In the projection in the first present invention, a conductive film, which is the above-mentioned metal composing the conductive film, is different from the conductive material composing the core material. Further, even when the conductive material composing the core material is the same metal as the conductive film, if this conductive material does not contain an additive component such as a phosphoric component contained or contains a different kind of additive component, it is different from the material of the conductive film. In addition, naturally, the conductive material is different from the material of the conductive film even when the conductive material composing the core material is a metal different from that of the conductive film.

As the above conductive material composing the core material, there are given, for example, metals, oxides of metal, conductive nonmetals such as graphite, and conductive polymers such as polyacetylene. Among others, metals are preferably used since they have high conductivity. In addition, metals may be alloys and therefore it is preferred to use at least one or more species of metal.

As the above metal, there are given, for example, metals such as gold, silver, copper, platinum, zinc, iron, lead, tin, aluminum, cobalt, indium, nickel, chrome, titanium, antimony, bismuth, germanium and cadmium; and alloys composed of two or more species of metals such as tin-lead alloy, tin-copper alloy, tin-silver alloy and tin-lead-silver alloy. Among others, nickel, copper, silver and gold are preferred. The above metal composing the core material may be identical to or may be different from the above metal composing the conductive film. When the core material is composed of the same metal as the metal composing the conductive film, the contents of additive components of the core material and the conductive film are varied from each other.

The shape of the core material in the first present invention is not particularly limited, but it is preferably lump-shaped because the projection easily appears to the extent that can be adequately observed. As a substance having a shape in lump form, there are given, for example, a lump in particle form, an agglomerate by agglomeration of particles and an infinite lump.

A method of producing the conductive particle of the first present invention is not particularly limited and includes, for example, a method in which the core material is attached on the surface of the base particle and the conductive film is formed by electroless plating described later to cover the core material and the base particle; a method in which the surface of the base particle is covered by forming the conductive film by electroless plating and then to this, the core material is attached and further the conductive film is formed by electroless plating to cover the covered base particle and the core material; and a method in which the conductive film is formed to cover the core material and the particles by using sputtering in place of electroless plating in the above-mentioned methods.

(Second Present Invention)

A conductive particle of the second present invention is a conductive particle, which has a core material in particle form, composed of a conductive material, on the surface of a base particle, in which the base particle and the core material are covered with a plated coat and which has projections formed by projecting of the plated coat by thus covering the core material.

The core material in the second present invention has a shape in particle form. This shape is not particularly limited as long as it is in particle form, and it may be, for example, spherical, disciform, columniform, plate form, cuboid or rectangular form.

Further, hardness of the core material in the second present invention is not particularly limited, but it is preferred to have such moderate hardness that the core material pushes through an insulation film formed on the surface of the electrode but it is crushed by the electrode.

As the conductive material in the second present invention, there are given materials similar to those described in the conductive material composing the core material in the first present invention.

The conductive particle of the second present invention is constructed using a projection particle formed by attaching the core material in particle form on the surface of the base particle.

A method of producing the projection particle in the second present invention is not particularly limited as long as it is a method of forming the core material in particle form on the surface of the base particle and it include, for example, a method in which the conductive material is added to a dispersion of the base particle and the core materials are collected on the surface of the base particle by, for example, van der Waals forces and the core material is attached to the base particle; and a method in which the conductive material is added to a container containing the base particle and the core material is attached to the surface of the base particle by mechanical actions through the rotation of the container or the like. Among others, there is suitably used a method of collecting the core materials on the surface of the base particle in a dispersion and attaching the core material to the base particle since an amount of the core material to be attached is easily controllable.

As the method of collecting the core materials on the surface of the base particle in a dispersion and attaching the core material to the base particle, more specifically, there is preferably used the core material having the longest outer diameter within a range of 0.5 to 25% of an average particle diameter of the base particles. More preferably, the core material having the longest outer diameter within a range of 1.5 to 15% of an average particle diameter of the base particles is used. In consideration of the dispersibility of the core material in a dispersion medium, it is preferred that specific gravity of the core material is as small as possible. Further, it is preferred to use deionized water as a dispersion medium in order not to change significantly the surface charges of the base particle and the core material.

The core material in particle form in the second present invention exists on the surface of the base particle. It is more preferred that at least 80% or more of the core material in particle form existing on the surface of the base particle contacts with the base particle or exists within a range of 5 nm from the base particle.

By contacting with the base particle or existing at a position close to the base particle, the core material in particle form will be surely covered with a plated coat. Therefore, it is possible to attain the conductive particle having the excellent cohesion of the projecting projection portions to the base particle. Further, since the core material contacts with the base particle or exists at a position close to the base particle, projections on the surface of the plated coat can be uniform.

Further, when the sizes of the core materials are uniform, it is easy to obtain the conductive particle in which the heights of the projections projecting from the surface of the plated coat are uniform. Therefore, when the above conductive particle is used as an anisotropic conductive material, it is possible to attain an effect of reducing the variations of conduction performance of the conductive particle and having excellent conduction reliability in connecting between electrodes.

The conductive particle of the second present invention is formed by covering the above projection particle with a plated coat.

Accordingly, projections in the second present invention is composed of the above core material in particle form and the above plated coat and presents itself as a projection formed by projecting of the surface of the plated coat.

As a metal composing the above plated coat, there are given metals similar to those described in the conductive film in the first present invention.

A method of forming the above plated coat is not particularly limited and includes, for example, methods such as electroless plating and electroplating. When the base particle is a nonconductive resin particle or the like, a method of forming the plated coat by electroless plating is suitably used, and particularly, electroless nickel plating is more suitably used.

A film thickness of the above plated coat is preferably within a range of 10 to 500 nm. When the film thickness is less than 10 nm, it may be difficult to obtain desired conductivity, and when it is more than 500 nm, this conductive film may become apt to peel because of the difference of thermal expansion coefficients between the base particle and the plated coat.

(Base Particle)

The base particle in the present invention may be an inorganic material or organic material as long as it has a moderate elastic modulus, an elastic deformation property and a restitution property, and is not particularly limited but it is preferably a resin particle composed of resin since the resin particle deforms elastically and has a high restitution property.

A material which composes the above resin particle is not particularly limited and includes, for example, polyolefins such as polyethylene, polypropylene, polystyrene, polyvinyl chloride, polyvinylidene chloride, polytetrafluoroethylene, polyisobutylene and polybutadiene; acrylic resins such as polymethyl methacrylate and polymethyl acrylate; copolymer resin of acrylate and divinylbenzene, polyalkylene terephthalate, polysulfone, polycarbonate, polyamide, phenol/formaldehyde resin, melamine/formaldehyde resin, benzoguanamine/formaldehyde resin and urea/formaldehyde resin. These materials composing the resin particle may be used singly or in combination of two or more species.

An average particle diameter of the above base particles is preferably within a range of 1 to 20 μm and more preferably within a range of 1 to 10 μm. When the average particle diameter is less than 1 μm, the base particles may be apt to agglomerate and hard to become a single particle, for example, in conducting electroless plating, and when it is more than 20 μm, it may be out of bounds within which the base particles are used as an anisotropic conductive material between board electrodes.

(Projection)

The shape of the projection in the present inventions is not particularly limited, but since the base particle and the core material are enveloped in and covered with the conductive film in the first present invention, or the plated coat in the second present invention, the shape of the projection depends on the shape of the above core material.

An average height of the projection portions projecting in the present inventions is preferably 0.5% or more and 25% or less of an average particle diameter of the conductive particles.

The above average height of the projection portions depends on the size of the core material and the conductive film in the first present invention, or the plated coat in the second present invention. When the average height is less than 0.5% of the average particle diameter of the conductive particles, it is difficult to attain an effect of a projection, and when the average height is more than 25%, the projection may deeply dig into the electrode to break the electrode.

The range of the above average height of the projection portions is preferably 3 to 17% of the average particle diameter of the conductive particles and more preferably 10 to 17%.

Incidentally, the average height of the projection portions can be determined by a measuring method by an electron microscope described later.

When the conductive particle of the present invention is used as an anisotropic conductive material, since it has the projecting projection, the projecting projection facilitates displacing a binder resin or pushing through an insulation film formed on the surface of an electrode in connecting between electrodes. Therefore, when the conductive particle of the present invention is used as an anisotropic conductive material, the good stability of connection can be developed in connecting between electrodes.

The cohesion between the core material and the base particle depends on the size of the core material and the conductive film in the first present invention, or the plated coat in the second present invention. When the core material is covered with the conductive film having a larger film thickness or the plated coat having a larger film thickness, the projection is resistant to detaching.

When the longest outer diameter of the core material is taken as X and the film thickness of the conductive film or the plated coat is taken as Y, a ratio X/Y is preferably within a range of 0.5 to 5. It is preferred to select the size of the core material and the film thickness of the conductive film or the plated coat in such a way that the ratio X/Y falls within this range.

An existence density of the projections in the present invention is important since it has a large effect on the performance of the conductive particle of the present invention.

If the existence density of the projections is represented as number of projections per one conductive particle, the existence density of the projections is preferably 3 or more. More preferably, the existence density of the projections is 8 or more. If the existence density of the projections is 3 or more, the projection contacts with an electrode and a connection state becomes good regardless of how the conductive particle is oriented when connecting between electrodes on the occasion of using the conductive particle of the present invention as an anisotropic conductive material, The existence density of the projections can be easily controlled, for example, by changing an amount of the core material to be added with respect to a surface area of the base particle.

In the present invention, since the core material composed of the conductive material is enveloped in and covered with the conductive film in the first present invention or the plated coat in the second present invention, a projection portion exhibits good conductivity. Therefore, when the conductive particle of the present invention is used as an anisotropic conductive material, it is possible to attain an effect of reducing the connection resistance by virtue of projections having good conductivity in connecting between electrodes.

Further, when the above core material having a shape in lump form or particle form has a uniform size, the projection portion of a uniform size can be obtained and therefore a conductive particle having a low connection resistance, a small variation of conduction performance of the conductive particle, and excellent conduction reliability can be obtained.

(Gold Layer)

In the conductive particle of the present invention, the conductive film or the plated coat, the outermost surface of which is a gold layer, is preferably formed.

By using the gold layer for the outermost surface, the connection resistance can be reduced and the surface can be stabilized.

Further, when the conductive film in the first present invention or the plated coat in the second present invention is a gold layer, the connection resistance can be reduced and the surface can be stabilized without newly forming the gold layer described above.

When the gold layer is used as the outermost surface, the projecting projection portion in the present invention is a portion formed by projecting the gold layer of the outermost surface of the conductive particle. That is, a projection, formed by projecting the conductive film in the first present invention or the plated coat in the second present invention, presents itself as a projection portion projecting from the outermost surface of the conductive particle.

The above gold layer can be formed by a publicly known method such as electroless plating, displacement plating, electroplating and sputtering.

A film thickness of the above gold layer is not particularly limited but it is preferably within a range of 1 to 100 nm and more preferably within a range of 1 to 50 nm. When the film thickness is less than 1 nm, for example, the prevention of oxidation of a substrate of a nickel layer may become difficult and the connection resistance may be increased. When it is more than 100 nm, the gold layer may erode the substrate of a nickel layer and causes the cohesion between the base particle and the substrate of a nickel layer to deteriorate, for example, in displacement plating.

Further, when the gold layer is formed by displacement gold plating, a part of the projection formed by the core material may elute into a gold plating and be lost since the nickel layer tends to elute into a gold plating. Accordingly, the gold layer is preferably formed by reduced gold plating.

(Method of Measuring Characteristics)

Various characteristics of the conductive particle in the present invention, for example, the film thickness of the conductive film or the plated coat, the film thickness of the gold layer, the average particle diameter of the base particles, the average particle diameter of the conductive particles, the shape of the core material, the longest outer diameter of the core materials, the shape of the projection, the average height of the projection portions, the existence densities of the projections, can be obtained by observing the conductive particle or the cross section of the conductive particle with an electron microscope.

As a method of preparing a specimen for observing the cross section as described above, there is give a method in which a substance prepared by burying the conductive particle in a thermosetting resin and curing the resin by heat is ground to a mirror-smooth state which can be observed using a specified abrasive paper or abrasive.

The conductive particle is observed with a scanning electron microscope (SEM), and as for a magnification, an easy-to-observe magnification may be selected and the conductive particle is observed under a magnification of, for example, 4000 times. In addition, the cross section of the conductive particle is observed with a transmission electron microscope (TEM), and as for a magnification, an easy-to-observe magnification may be selected and the conductive particle is observed under a magnification of, for example, 100000 times.

The above average film thicknesses of the conductive film, the plated coat and the gold layer of the conductive particles are obtained by measuring film thicknesses on 10 particles selected at random and averaging the results arithmetically. Further, if a film thickness in each conductive particle is uneven, a maximum film thickness and a minimum film thickness are measured and a mathematical average value of the measurement is assumed to be a film thickness.

The above average particle diameter of the base particles is a value obtained by measuring a particle diameter on 50 base particles selected at random and averaging the results arithmetically.

The above average particle diameter of the conductive particles is a value obtained by measuring a particle diameter on 50 conductive particles selected at random and averaging the results arithmetically.

The above average height of the projection portions is determined by measuring the heights of 50 projection portions, the whole areas of which are observed among many recognized projection portions. In this time, taking an area where a projection of the conductive film or the plated coat forming the outermost surface is not formed as a reference surface, a height of a portion which presents itself as a projection is measured and an average height of the projection portions is determined by averaging measured heights mathematically. In addition, in order to attain an effect of providing the projection with reliability, it is given that the projection has an average height of 0.5% or more with respect to an average particle diameter of the conductive particles.

As for above existence density of the projections, a projection, in which the above height of the projection portion is 3% or more of the average particle diameter of the conductive particle, a more preferable range, is considered as a projection and number of these projections was counted on 50 conductive particles selected at random to determine number of projections per one conductive particle. This number of projections per one conductive particle is assumed to be the existence density of projections.

(Electroless Plating)

The plated coat in the present invention can be formed by, for example, an electroless nickel plating method. As a method of performing the above electroless nickel plating, there is given, for example, a method in which an electroless nickel plating solution, which is composed by using sodium hypophosphite as a reducing agent, is initially made up in an electrolytic bath according to a predetermined procedure and heated, and in this, the base particle provided with catalyst are immersed to precipitate a nickel layer by a reduction reaction expressed by a chemical equation, $Ni^{2+}+H_2PO_2^-+H_2O \rightarrow Ni+H_2PO_3^-+2H^+$.

As a method of providing catalyst for the base particle described above, there is given, for example, a method in which the base particle composed of resin is subjected to alkali cleaning, acid neutralization and sensitization in a tin dichloride ($SnCl_2$) solution to perform an electroless plating pretreatment step in which activating in a palladium dichloride ($PdCl_2$) solution is carried out. Incidentally, sensitization is a step in which $Sn^{2+}$ ion adsorbs on the surface of an insulating material and activating is a step of causing a reaction expressed by a chemical equation, $Sn^{2+}+Pd^{2+} \rightarrow Sn^{4+}+Pd^0$, on the surface of an insulating material to form palladium as a catalyst nucleus of electroless plating.

Here, when the projection particle in the second present invention described above is produced, it is preferred that palladium exists on the surface of the base particle. That is, the conductive particle of the second present invention is preferably a substance formed by attaching the core material to the base particle, on the surface of which palladium exists, and covering the core material with the plated coat by electroless plating originating from the palladium.

(Anisotropic Conductive Material)

Next, the anisotropic conductive material of the present invention is composed of the conductive particles of the present invention described above and a resin binder, and the conductive particles are preferably dispersed in the resin binder.

The above anisotropic conductive material is not particularly limited and includes, for example, anisotropic conductive paste, anisotropic conductive ink, an anisotropic conductive pressure sensitive adhesive/an anisotropic conductive adhesive, an anisotropic conductive film and an anisotropic conductive sheet.

A method of preparing the anisotropic conductive material of the present invention is not particularly limited and includes, for example, a method in which the conductive particles of the present invention are added to an insulative resin binder and this mixture is uniformly mixed to disperse the particles to form, for example, anisotropic conductive paste, anisotropic conductive ink and an anisotropic conductive pressure sensitive adhesive/an anisotropic conductive adhesive. Further, there is given a method in which after the conductive particles of the present invention are added to an insulative resin binder and this mixture is uniformly mixed to form a conductive composition, this conductive composition is uniformly dissolved (dispersed) in an organic solvent as required or this conductive composition is heated and melted, and the resulting solution (dispersion) is applied to the release treatment surface of a release material such as a release paper and a release film so as to obtain a desired film thickness and dried or cooled as required to form, for example, an anisotropic conductive film or an anisotropic conductive sheet. Of these methods, an appropriate preparation method may be employed in response to the kind of the anisotropic conductive material to be prepared. In addition, the insulative resin binder and the conductive particles of the present invention maybe used separately without mixing them to form the anisotropic conductive material, The above insulative resin binder is not particularly limited and includes, for example, vinyl resins such as vinyl acetate resin, vinyl chloride resin, acrylic resin and styrene resin; thermoplastic resins such as polyolefin resin, ethylene-vinyl acetate copolymer and polyamide resin; curable resins comprising epoxy resin, urethane resin, acrylic resin, polyimide resin, unsaturated polyester resin and curing agent thereof; thermoplastic blocked copolymer such as styrene-butadiene-styrene blocked copolymer, styrene-isoprene-styrene blocked copolymer and hydrogenated compounds thereof; and elastomers (rubbers) such as styrene-butadiene copolymer rubber, chloroprene rubber and acrylonitrile-styrene blocked copolymer rubber. These resins may be used singly or in combination of two or more species. And, as the above curable resin, there may be used any curable type of room temperature setting type, thermosetting type, photocuring type and moisture curing type.

Into the anisotropic conductive material of the present invention, various additives such as a filler, a softening agent (a plasticizer), a tackiness/adhesion improver, an antioxidant (an age resister), a heat stabilizer, a light stabilizer, an ultraviolet absorber, a coloring agent, a flame retardant and an organic solvent may be mixed in addition to the insulative resin binder and the conductive particle of the present invention to the extent of not interfering the attainment of the object of the present invention as required. These various additives may be used singly or in combination of two or more species.

Figure 7:
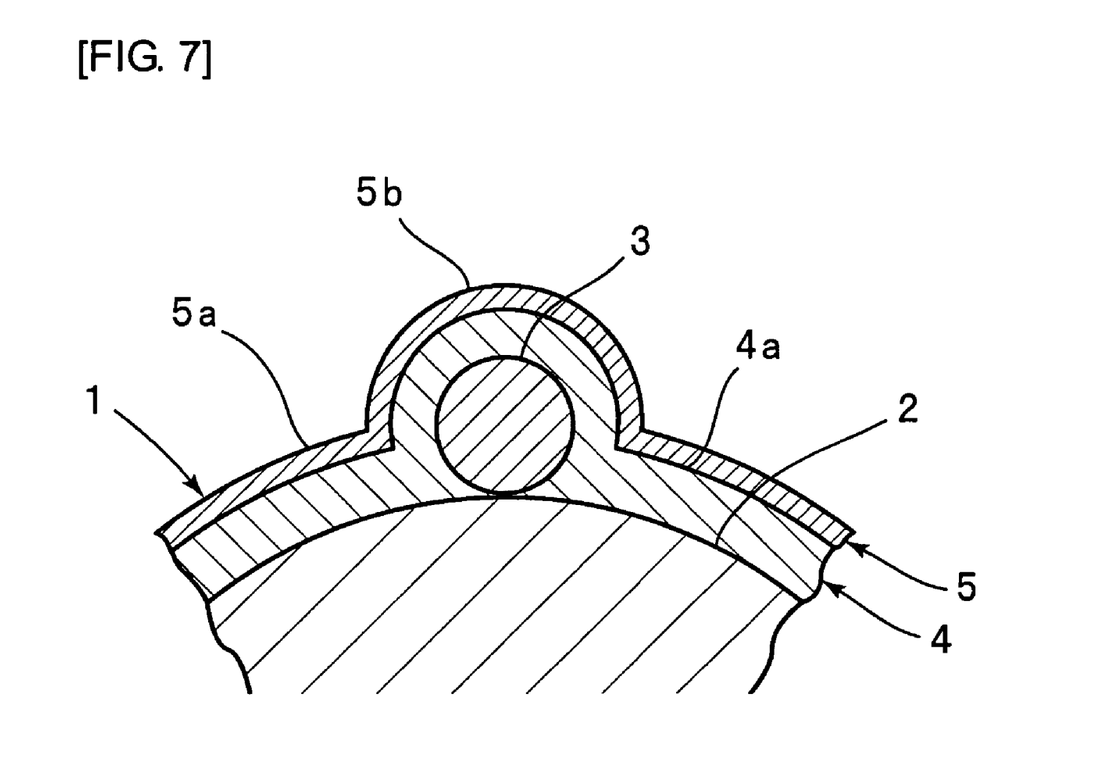
FIG. 7 is an enlarged elevational section view partially broken showing schematically a portion having a projecting projection of the conductive particle concerning an embodiment of the present invention.

In FIG. 7, a portion having a projecting projection of the conductive particle concerning an embodiment of the present invention is schematically shown by an elevational section view partially broken.

As shown in FIG. 7, the core material 3 in particle form is attached to the surface of the base particle 2 of the conductive particle 1. The base particle 2 and the core material 3 are covered with the plated coat 4. The surface 4a of the plated coat 4 is covered with the gold layer 5. The gold layer 5 has the projection 5b projected by the core material 3 on the surface 5a of the gold layer 5 which is the outermost surface.

Hereinafter, the present invention will be described in more detail by way of example. But, the present invention is not limited to the following examples.

EXAMPLE 1

(Electroless Plating Pretreatment Step)

10 g of base particles with an average particle diameter of 3 μm composed using a copolymer resin of tetramethylolmethane tetraacrylate and divinylbenzene were subjected to alkali cleaning and acid neutralization by an aqueous solution of sodium hydroxide and sensitization in a tin dichloride solution. Then, the base particles were subjected to electroless plating pretreatment in which activating in a palladium dichloride solution was performed, and filtered/cleaned to obtain base particles, the surface of which palladium was attached to.

(Core Material Combining Step)

The obtained base particles were stirred for 3 minutes in 300 ml of deionized water and dispersed in water. Then, to this aqueous dispersion, 1 g of metal nickel particle slurry ("2020SUS" produced by MITSUI MINING & SMELTING CO., LTD., average particle diameter 200 nm) was added over 3 minutes to obtain base particles, the surface of which a core material was attached to.

(Electroless Nickel Plating Step)

Electroless Plating First Half Step

The obtained base particles were further diluted with 1200 ml of water, and to this, 4 ml of a plating stabilizer was added. Then, to this aqueous solution, 120 ml of a mixed solution formed by mixing 450 g of nickel sulfate, 150 g of sodium hypophosphite, 116 g of sodium citrate and 6 ml of a plating stabilizer per 1 liter of the mixed solution was added at an addition rate of 81 ml/minute through a metering pump. Then, this mixture was stirred until a pH is stabilized and a halt on the formation of hydrogen foam was confirmed.

Electroless Plating Late Half Step

Next, to the above solution, 650 ml of a mixed solution formed by mixing 450 g of nickel sulfate, 150 g of sodium hypophosphite, 116 g of sodium citrate and 35 ml of a plating stabilizer per 1 liter of the mixed solution was further added at a addition rate of 27 ml/minute through a metering pump. Then, this mixture was stirred until a pH is stabilized and a halt on the formation of hydrogen foam was confirmed.

Next, the plating solution was filtered, and a filter cake was washed with water and then dried at 80° C. in a vacuum drier to obtain nickel-plated conductive particles.

(Gold Plating Step)

Then, the respective surfaces of these nickel-plated conductive particles were further gold-plated by a displacement plating method to obtain gold-plated conductive particles.

EXAMPLE 2

Nickel-plated conductive particles were obtained by following the same procedure as in Example 1 except for using metal nickel particle slurry ("2007SUS" produced by MITSUI MINING & SMELTING CO., LTD., average particle diameter 50 nm) in place of metal nickel particle slurry ("2020SUS" produced by MITSUI MINING & SMELTING CO., LTD., average particle diameter 200 nm) in core material combining step.

Then, the respective surfaces of these nickel-plated conductive particles were further gold-plated by a displacement plating method to obtain gold-plated conductive particles.

COMPARATIVE EXAMPLE 1

Nickel-plated conductive particles were obtained by following the same procedure as in Example 1 except for not applying the core material combining step to the base particles after the electroless plating pretreatment step.

Then, the respective surfaces of these nickel-plated conductive particles were further gold-plated by a displacement plating method to obtain gold-plated conductive particles.

COMPARATIVE EXAMPLE 2

Nickel-plated conductive particles were obtained by following the same procedure as in Example 1 except that the core material combining step was not applied to the base particles after the electroless plating pretreatment step, and in the electroless nickel plating step, 1 ml of a plating stabilizer was added in place of 4 ml of the plating stabilizer in the first half step and the plating stabilizer was not added in the late half step. In the electroless nickel plating step, self-decomposition of a plating solution occurred.

Then, the respective surfaces of these nickel-plated conductive particles were further gold-plated by a displacement plating method to obtain gold-plated conductive particles.

(Evaluation of Conductive Particle)

The nickel-plated conductive particles obtained in Examples 1, 2 and Comparative Examples 1, 2 were observed with a scanning electron microscope (SEM) manufactured by Hitachi High-Technologies Corporation.

Figure 1:
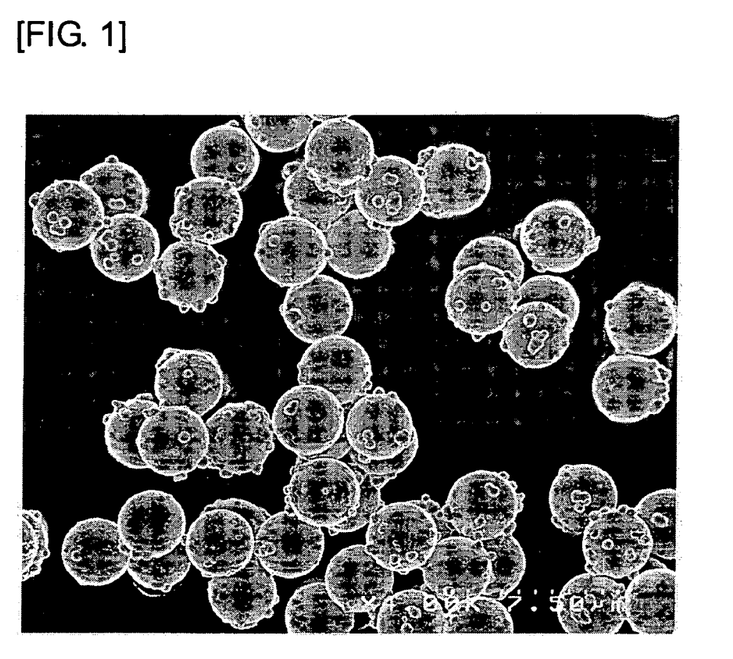
FIG. 1 is a SEM photograph (a magnification 4000 times) of nickel-plated conductive particles obtained in Example 1.

A SEM photograph of Example 1 is shown in FIG. 1. In the nickel-plated conductive particle of Example 1, there were observed projections projecting from the surface of the plated coat.

Figure 2:
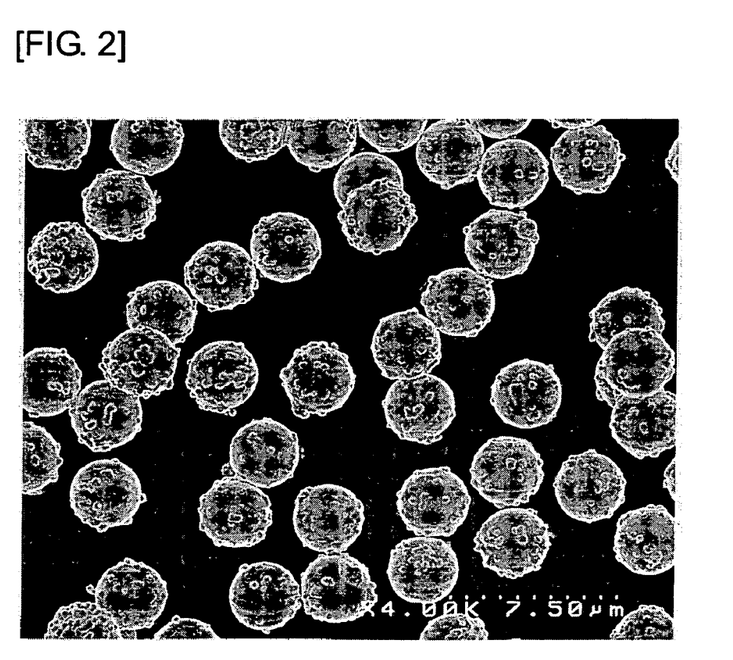
FIG. 2 is a SEM photograph (a magnification 4000 times) of nickel-plated conductive particles obtained in Example 2.

A SEM photograph of Example 2 is shown in FIG. 2. In the nickel-plated conductive particle of Example 2, there were observed projections projecting from the surface of the plated coat.

Figure 3:
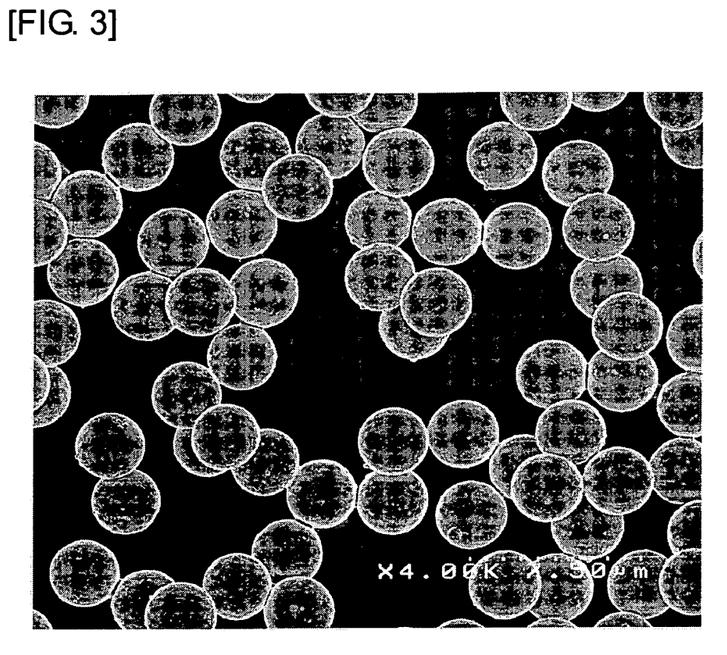
FIG. 3 is a SEM photograph (a magnification 4000 times) of nickel-plated conductive particles obtained in Comparative Example 1.

A SEM photograph of Comparative Example is shown in FIG. 3. In the nickel-plated conductive particle of Comparative Example 1, there was not observed a projection.

Figure 4:
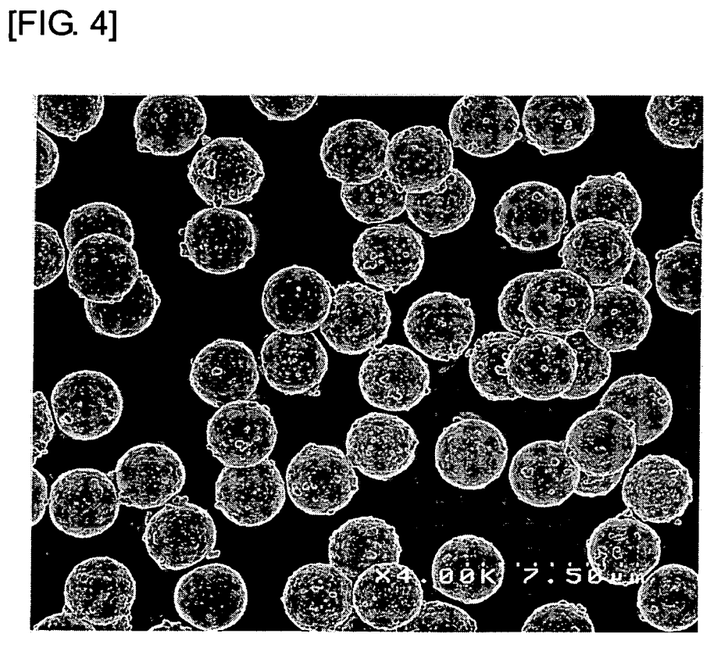
FIG. 4 is a SEM photograph (a magnification 4000 times) of nickel-plated conductive particles obtained in Comparative Example 2.

A SEM photograph of Comparative Example 2 is shown in FIG. 4. In the nickel-plated conductive particle of Comparative Example 2, there were observed projections projecting from the surface of the plated coat but both shapes and sizes of the projections are nonuniform.

Further, the cross sections of the nickel-plated conductive particles obtained in Example 1 and Comparative Example 2 were observed with a transmission electron microscope (TEM) manufactured by JEOL DATUM LTD.

Figure 5:
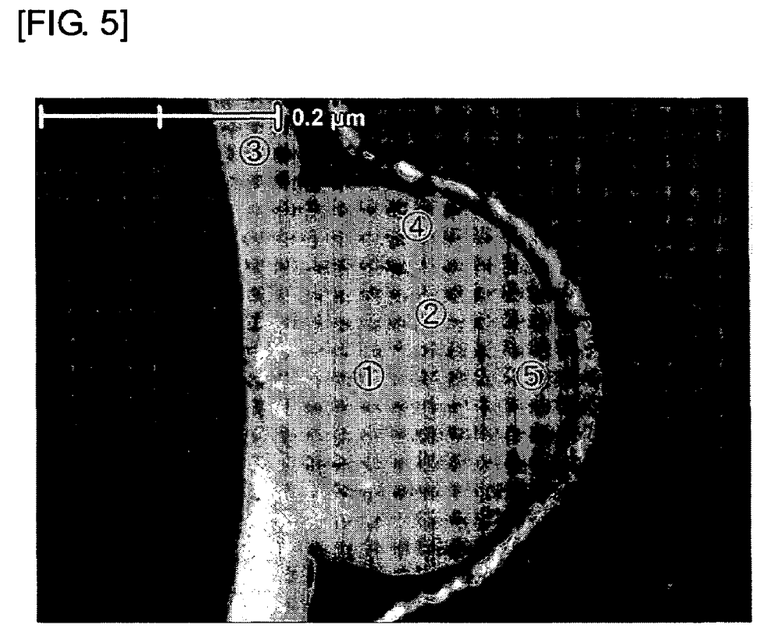
FIG. 5 is a TEM photograph (a magnification 100000 times) of a cross section of a nickel-plated conductive particle obtained in Example 1.

In this time, an energy dispersion type X-ray spectroscope (EDS) qualitative analysis was performed for a composition analysis. A TEM photograph of Example 1 is shown in FIG. 5. In the nickel-plated conductive particle of Example 1, the composition of the plated coat was different from that of the core material.

Figure 6:
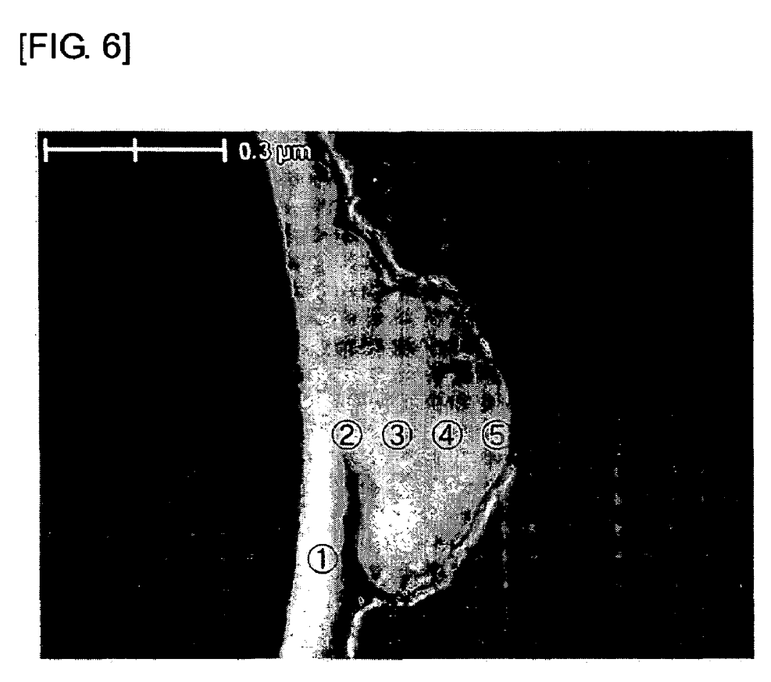
FIG. 6 is a TEM photograph (a magnification 100000 times) of a cross section of a nickel-plated conductive particle obtained in Comparative Example 2.

A TEM photograph of Comparative Example 2 is shown in FIG. 6. In the nickel-plated conductive particle of Comparative Example 2, the composition of the plated coat was same as that of the projection portion within the coat.

In addition, a substance found on the outermost surfaces in FIGS. 5 and 6 are platinum layers deposited by vapor deposition for measurement, and the inner side thereof is a deposition layer (principal component carbon) for protecting samples, and a layer on the further inner side of the deposition layer is a layer of the nickel-plated conductive particles obtained in Example 1 or Comparative Example 2.

Further, the nickel-plated and gold-plated conductive particles obtained in Examples 1, 2 and Comparative Examples 1, 2 were observed with a scanning electron microscope (SEM) manufactured by Hitachi High-Technologies Corporation and the cross sections of the same conductive particles were observed with a transmission electron microscope (TEM) manufactured by JEOL DATUM LTD.

Film thicknesses of the plated coats, film thicknesses of the gold layers and existence densities of the projections of these conductive particles are shown in Table 1.

By the above observations, it was confirmed that the core material of the conductive particle of Example 1 has a shape in particle form. On the other hand, it was confirmed that the core material of the conductive particle of Example 2 has a shape in particle form.

(Evaluation of Anisotropic Conductive Material)

Anisotropic conductive materials were prepared using the conductive particles obtained in Examples 1, 2 and Comparative Examples 1, 2, and a resistance between electrodes and the presence or absence of a leakage current between electrodes of each anisotropic conductive material were evaluated.

100 parts by weight of epoxy resin (produced by Yuka Shell Epoxy K.K., "Epikote 828") as a resin for a resin binder, 2 parts by weight of tris(dimethylaminoethyl)phenol and 100 parts by weight of toluene were well mixed using a planetary mixer. Then, this solution was applied onto a release film in such a way that a dried film thickness is 10 µm, and toluene was vaporized to obtain an adhesive film.

Next, to a mixture of 100 parts by weight of epoxy resin (produced by Yuka Shell Epoxy K.K., "Epikote 828") as a resin for a resin binder, 2 parts by weight of tris(dimethylaminoethyl)phenol and 100 parts by weight of toluene, the conductive particle obtained in Example 1, Example 2, Comparative Example 1 or Comparative Example 2 was added, and this mixture was well mixed using a planetary mixer. Then, the resulting mixture was applied onto a release film in such away that a dried film thickness is 7 µm, and toluene was vaporized to obtain an adhesive film containing the conductive particle. An amount of the conductive particle to be mixed was selected so as to be 50000/cm$^2$ in terms of the particle content in the film.

An anisotropic conductive film of 17 µm in thickness, having a two-layer structure, was obtained by laminating the adhesive film and the adhesive film containing the conductive particle which were obtained at room temperature.

The obtained anisotropic conductive film was cut into a piece having a size of 5 mm×5 mm. This piece was bonded to the about middle of an aluminum electrode 200 µm wide, 1 mm long and 0.2 µm thick with L/S of 20 µm, having a lead for measuring the resistance on one side. Then, glass substrates having the same aluminum electrode were aligned with each other in such away that one electrode overlays the other electrode and bonded.

After joining portions of these glass substrates were attached to each other under the conditions of attaching by pressure and heat of 10 N and 100° C., a resistance between electrodes and the presence or absence of a leakage current between electrodes were evaluated. These results of evaluations are shown in Table 1.

TABLE 1

|  | Nickel Film Thickness (nm) | Gold Film Thickness (nm) | Existence Density of Projection | Compositions of Plated Coat and Core Material*[1] or of Plated Coat and Projection Portion on Inner Side of Coat*[2] | Resistance Between Electrodes (Ω) | Presence or Absence of Leakage Current Between Electrodes |
|---|---|---|---|---|---|---|
| Ex. 1 | 70 | 30 | 8.7 | Different*[1] | 4 | Absent |
| Ex. 2 | 70 | 30 | 7.5 | Different*[1] | 4 | Absent |
| Comp. Ex. 1 | 70 | 30 | No Projection | — | 20 | Absent |
| Comp. Ex. 2 | 70 | 30 | 4.0 | Same*[2] | 5 | Present |

The invention claimed is:

1. A conductive particle comprising:
   a base particle;
   core materials disposed on the surface of the base particle to form projections on the outer surface of the base particle; and
   a conductive film or conductive films covering the surface of said base particle and said core materials, such that said projections are formed by said core materials;
   wherein the core materials are composed of a conductive material different from a conductive material composing said conductive film or conductive films.

2. The conductive particle according to claim 1, wherein said core material has a shape in lump form.

3. The conductive particle according to claim 1 or 2, wherein the outermost surface of said conductive film is a gold layer.

4. A conductive particle comprising:
   a base particle;
   core materials disposed on the surface of the base particle to form projections on the outer surface of the base particle; and
   a plated coat covering the surface of said base particle and said core materials, such that said projections are formed by said core materials;
   wherein said core materials are made of a conductive material.

5. The conductive particle according to claim 4, wherein at least 80% or more of said core material existing on the surface of said base particle contacts with said base particle or exists within a range of 5 nm from said base particle.

6. The conductive particle according to claim 4 or 5, wherein the outermost surface of said plated coat is a gold layer.

7. The conductive particle according to claim 1 or 4, wherein said core material is composed of at least one or more species of metal.

8. The conductive particle according to claim 1 or 4, wherein said base particle is a resin particle.

9. The conductive particle according to claim 1 or 4, wherein an average height of said projection portions projecting is 0.5% or more of an average particle diameter of said conductive particle.

10. An anisotropic conductive material comprising a resin binder and the conductive particle according to claim 1 or 4 dispersed in said resin binder.

* * * * *